United States Patent
Bailey et al.

(10) Patent No.: US 7,606,044 B2
(45) Date of Patent: Oct. 20, 2009

(54) MULTI-PURPOSE STRUCTURAL SUPPORT I/O MEMBER FOR A SERVER

(75) Inventors: Edmond Ira Bailey, Cedar Park, TX (US); Laurent Andrew Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 156 days.

(21) Appl. No.: 11/758,997

(22) Filed: Jun. 6, 2007

(65) Prior Publication Data

US 2008/0304228 A1    Dec. 11, 2008

(51) Int. Cl.
*H05K 5/00* (2006.01)

(52) U.S. Cl. .................. 361/752; 361/800; 361/790

(58) Field of Classification Search ............ 361/752, 361/790, 797, 800; 312/223
See application file for complete search history.

(56) References Cited

U.S. PATENT DOCUMENTS

| | | | |
|---|---|---|---|
| 5,383,096 A * | 1/1995 | Benson et al. ............. 361/816 |
| 5,650,911 A * | 7/1997 | Scholder et al. ........... 361/684 |
| 5,684,671 A | 11/1997 | Hobbs et al. ............... 361/683 |
| 5,822,182 A * | 10/1998 | Scholder et al. ........... 361/683 |
| 6,339,536 B1 * | 1/2002 | Buican et al. .............. 361/818 |
| 6,550,877 B1 * | 4/2003 | Anderson et al. ........ 312/223.2 |
| 7,088,583 B2 | 8/2006 | Brandon et al. ........... 361/694 |
| 7,411,784 B2 * | 8/2008 | Coglitore et al. .......... 361/686 |

OTHER PUBLICATIONS

New Dell PowerEdge Servers Elevate Performance, Reliability, Manageability; Feature Customer-Inspired Design Enhancements, Dell Inc. Press Release, http://dell.com/content/topics/global.aspx/corp/pressoffice/en/2006/2006_06_07_rr_0..., 3 pages, Jun. 7, 2006.

* cited by examiner

*Primary Examiner*—Hung S Bui
(74) *Attorney, Agent, or Firm*—Baker Botts L.L.P.

(57) ABSTRACT

The teachings of the present disclosure provide a housing for a modular component of an information handling system. The housing may include a wall member generally defining a first plane, one or more holes formed in the wall member, and one or more structural support members adjacent to the one or more holes. The one or more structural supports may extend from the first plane defined by the wall member to resist deformation of the wall member in at least one direction.

19 Claims, 6 Drawing Sheets

MULTI-PURPOSE STRUCTURAL SUPPORT I/O MEMBER FOR A SERVER

TECHNICAL FIELD

The present disclosure relates in general to the manufacture of information handling systems, and more particularly to a system and method for providing structural support to a server chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more servers. In some applications, servers may be housed in a rack system. A 19-inch rack is a standardized system (e.g., EIA 310-D, IEC 60297, and/or DIN 41494 SC48D) which may be used to mount various electronic modules. Such electronic modules may be described as rack mounted, and may further be housed in a rack mount chassis. Such a chassis may include one or more walls configured to enclose components therein.

The height of a chassis or other rack mount component may be expressed as a multiple of a "unit" (e.g., 1U, 2U, and/or any other multiple of U), where the typical value for a unit is 1.75 inches or 44.45 millimeters. This standard rack arrangement is widely used throughout the information handling system industry, as well as in telecommunication, audio, and/or entertainment equipment.

1U server rack chassis are common modular components used in information handling systems. Structural integrity of the server rack chassis body may be important, not only for the protection of components housed within, but also to protect clearances and interfaces between the plurality of server rack chassis that may be present in a single rack. A condition known as sag occurs when any portion of the server rack chassis violates the rack space below the chassis.

Deformation of a housing may contribute to increased failure of surface mounted components within the housing. In modular components of information handling systems such as servers, deformation of a server rack chassis body may result in flexure of printed circuit boards, e.g., a motherboard. Flexure of a motherboard, for example, may result in increased failure of components surface mounted to the motherboard, e.g., a CPU socket, an I/O controller hub (ICH), and/or a memory controller hub (MCH).

It has been found that server rack chassis sag may be most prominent at the rear wall of the chassis body. Typical server rack chassis bodies include a rear wall of stamped sheet metal, e.g., steel and/or aluminum. The rear wall of a server rack chassis is often configured for allowing input/output connections from outside the chassis to the components contained therein. In addition, the rear wall is often punctured with vent openings in an attempt to increase the air flow in and/or out of the chassis body for cooling of the components therein. Each opening in a rear wall, whether for an input/output connection or for venting the chassis, may reduce the resistance of the rear wall to deformation.

In addition, server rack chassis bodies often contribute to the electromagnetic interference (EMI) and/or electrostatic discharge (ESD) transmission characteristics of the electronic components contained therein. Openings in the housing of a server rack chassis (e.g., the rear wall) may affect the EMI and/or ESD characteristics of a chassis body.

SUMMARY

In accordance with the teachings of the present disclosure, one embodiment of a housing for a modular component of an information handling system may include a wall member generally defining a first plane, one or more holes formed in the wall member, and one or more structural support members adjacent to the one or more holes. The one or more structural supports may extend from the first plane defined by the wall member to resist deformation of the wall member in at least one direction.

Another embodiment of the present disclosure may include a modular component of an information handling system. The modular component may include a wall member generally defining a first plane, one or more holes formed in the wall member, and one or more structural support members adjacent to the one or more holes. The one or more structural supports may extend from the first plane defined by the wall member to resist deformation of the wall member in at least one direction.

Another embodiment of the present disclosure may include a method of forming a housing for a modular component of an information handling system. The method may include using a casting process to form a wall member generally defining a first plane. The wall member may include one or more holes formed in the wall member and one or more structural support members adjacent to the one or more holes. The one or more structural supports may extend from the first plane defined by the wall member to resist deformation of the wall member in at least one direction.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 7, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Embodiments of the present disclosure may be used to prevent deformation of the housing of a modular component of an information handling system. In some embodiments, these teachings may be used to reduce sag in a server rack chassis body. Although the following discussion is focused on systems and methods related to reducing sag in a server rack chassis body, it should be understood that the disclosed systems and methods may be similarly applied to any housing or modular component of an information handling system and may be used to increase stability of the housing and/or modular component in any plane and/or direction.

A housing incorporating teachings of the present disclosure may serve to increase the resistance of a server rack chassis to sag and/or other deflection. For example, such a housing may include one or more structural support members extending from a rear wall member to resist deformation of the wall member which may be located at the rear of the chassis body. In addition, such a housing may demonstrate increased resistance to ESD and/or EMI through the housing. In an alternative embodiment, teachings of the present disclosure may be used to increase the number and/or size of holes in a wall member of a server rack chassis without increasing the tendency of the chassis to deform and/or decrease the chassis resistance to ESD/EMI transmission.

Although FIGS. 1-7 and the following discussion focus on the use of the present teachings with respect to the rear wall of a rack server chassis, the teachings may be applied to any member of such a chassis, or other rack component. The teachings may have particular application at any point of interface within a housing but specifically when a significant number of connectors are present. The teachings may provide appropriate systems and methods for providing connector openings while maintaining or increasing structural stability and/or other characteristics of the housing.

Figure 1:
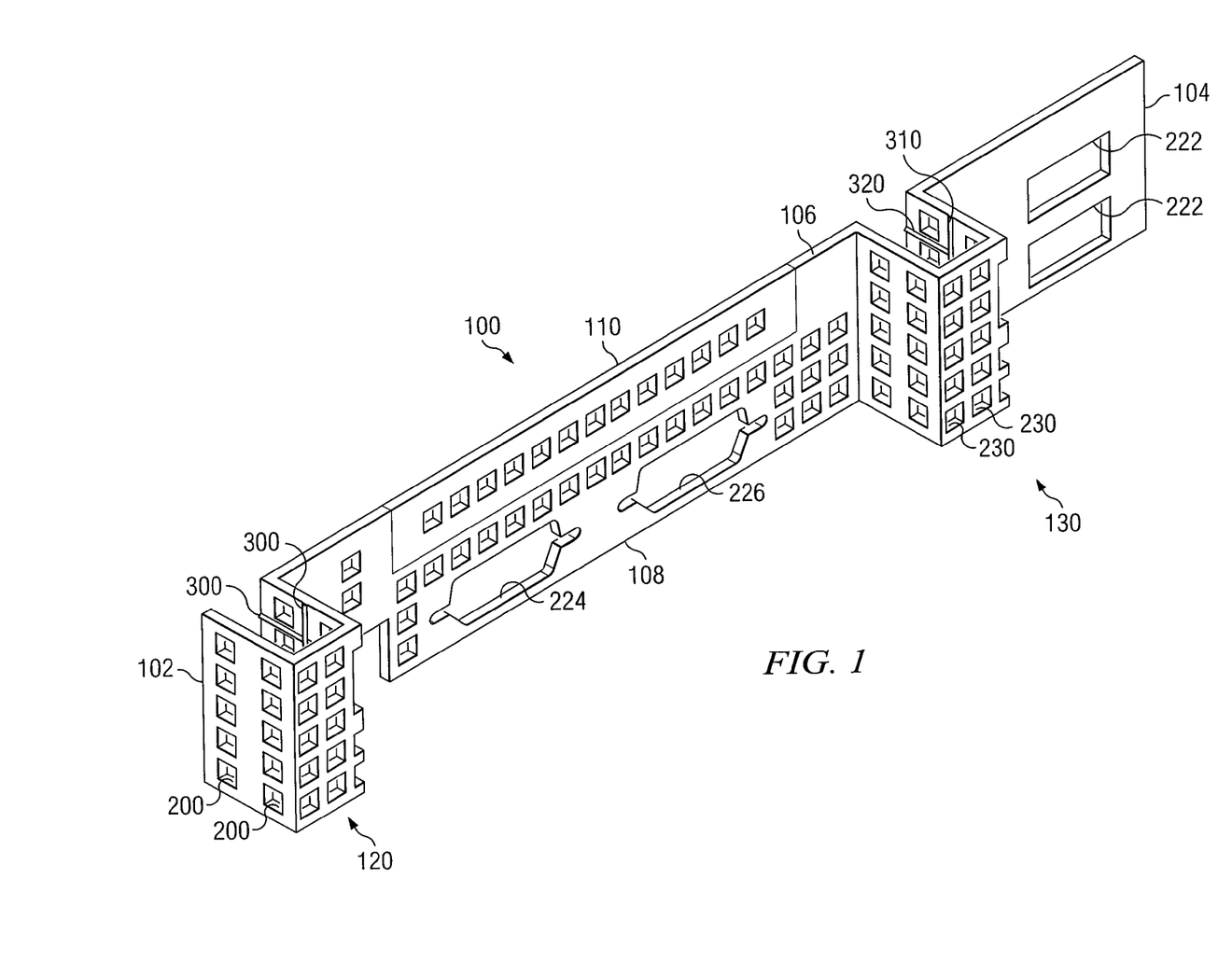
FIG. 1 depicts an isometric view of a wall member in accordance with teachings of the present disclosure.

FIG. 1 depicts an isometric view of a wall member 100 in accordance with teachings of the present disclosure. Wall member 100 may be any component of a housing for a modular component of an information handling system. Wall member 100 may be formed by any appropriate process that results in a generally planar member with appropriate features. For example, wall member 100 may be formed by casting an appropriate material (e.g., aluminum, steel, or other metal) into the desired shape.

FIG. 1 shows one embodiment of wall member 100 which may be configured for installation as the rear input/output wall of a server rack chassis body. Use in such an application may require one or more holes 200, which may be used to allow input/output connections through holes 200 and/or to vent air through holes 200. Wall member 100 may also include one or more structural support members 300 adjacent to holes 200. Structural support members 300 may extend from wall member 100 to resist deformation of wall member 100 in at least one direction.

Wall member 100 may include a left end 102, a right end 104, a top 106, and a bottom 108. Any such designations may be used for convenience in discussing FIGS. 1-8 of the present disclosure but are not to be construed as limiting the orientation or application of the teachings of the present disclosure. Although wall member 100 may include a generally planar body as shown in FIG. 1, wall member 100 may include various indentations and/or protrusions 120 and 130 configured for interfacing with various components of information handling system 10 as more fully described with relation to FIG. 8. In addition, protrusions such as those shown in FIG. 1 (120 and 130) may provide additional surface area useful for placing holes 200.

Holes 200 may include one or more slots 210. Slots 210 may be best seen as exposed in FIG. 6 and discussed in relation to FIG. 6.

Holes 200 may include one or more input/output holes 220. Input/output holes 220 may be any hole in wall member 100 configured for the connection of an input/output connector 620. For example, input/output holes 220 may include USB port 222, video port 224, power port 226, and/or any other connector that might be useful in an information handling system. In some embodiments, wall member 100 may include a lead-in feature around input/output holes 220. Such a feature may serve to ease installation of input/output connectors 620. For example, wall member 100 may include a chamfered edge around input/output holes 220 to guide input/output connection.

Holes 200 may include one or more vent holes 230. Vent holes 230 may be any hole in wall member 100 configured for venting air through wall member 100. Typically, electronic components in a housing must be cooled with fluid flowing from outside the housing. Such fluid flow often includes forced convection cooling provided by transferring air between the housing and the surrounding atmosphere by means of a fan and/or other source of fluid flow.

Persons having ordinary skill in the art will recognize that vent holes 230 may be any orientation, shape, and/or size, and may be configured to increase the open area of wall member 100. A wall member with increased open area may tend to reduce the pressure drop in fluid flowing through wall member 100. Reduced pressure drop may allow a person having ordinary skill in the art to reduce the power requirements of any cooling system in place. Reduced power requirements may result in reduced fan speed, power consumption, sound levels, acoustic performance, and/or other performance metrics.

In embodiments such as that shown in FIG. 1, vent holes 230 may be located anywhere along the length and height of wall member 100, including any indentations and/or protrusions such as those depicted as 120 and 130. Such embodiments provide increased surface area in comparison to flat planar walls, thereby allowing increased open area for venting air.

Figure 2:
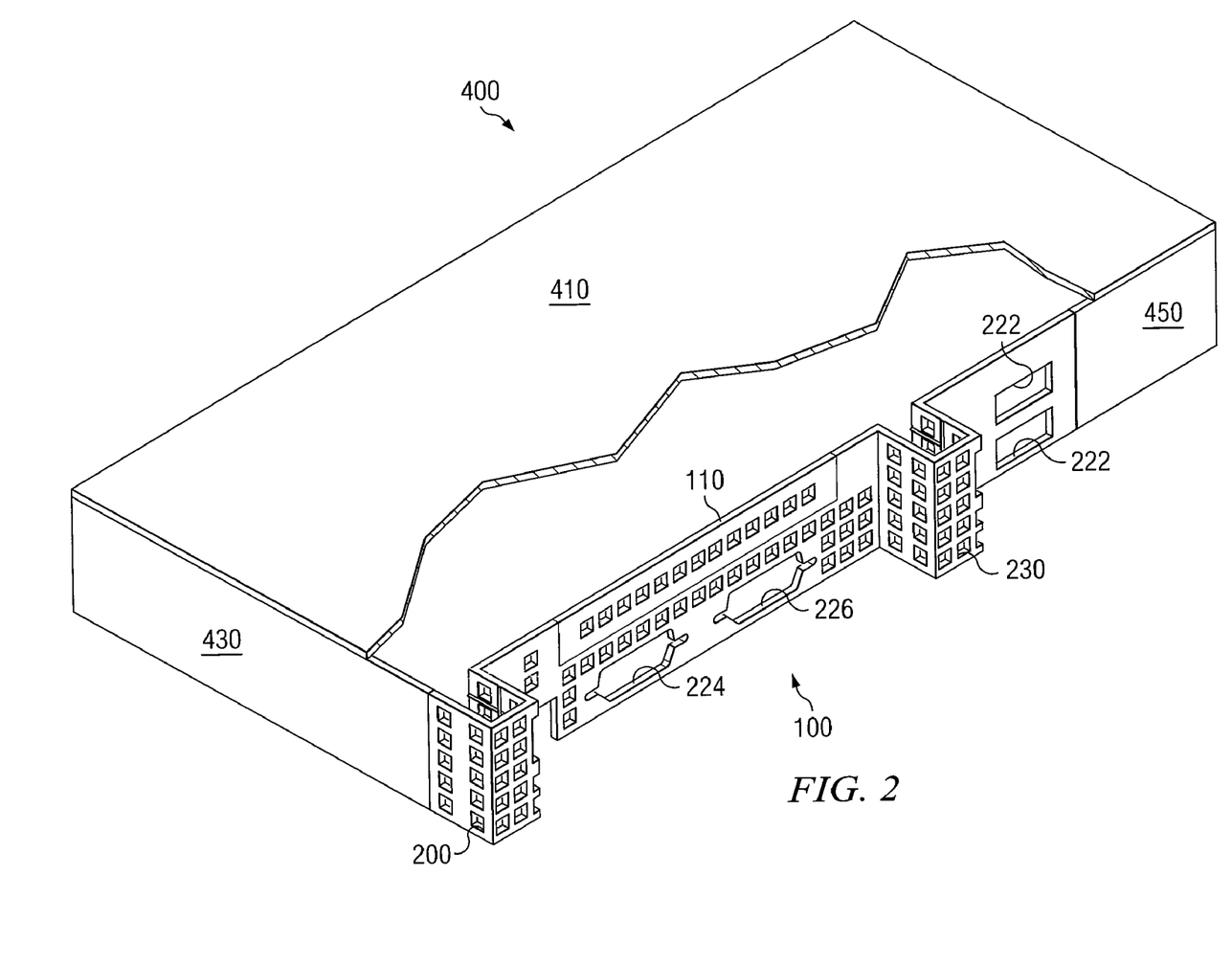
FIG. 2 depicts an isometric view of one embodiment of a chassis for a modular component of an information handling system incorporating a wall member in accordance with teachings of the present disclosure and with portions broken away.

FIG. 2 depicts an isometric view of one embodiment of a chassis 400 for a modular component of an information handling system incorporating a wall member in accordance with teachings of the present disclosure and with portions broken away. For example, chassis 400 may include a server rack chassis body. In such embodiments, chassis 400 may include a top 410, a bottom pan 420, two sidewalls 430, a front wall 440, and a rear wall 450. Chassis 400 may be formed using any method and any material appropriate for housing electronic components. For example, chassis 400 may be formed of stamped sheet metal.

Chassis 400 may include any features configured for connecting wall member 100 to top 410, bottom pan 420, sidewalls 430, and/or rear wall 450. In the embodiment shown in FIG. 2, wall member 100 may extend across some part of the rear of chassis 400 and combine with rear wall 450 of extend across the entire rear of chassis 400. In other embodiments, wall member 100 may not fully extend between top 410 and bottom 420, or wall member 100 may fully extend between sidewalls 430.

Figure 3:
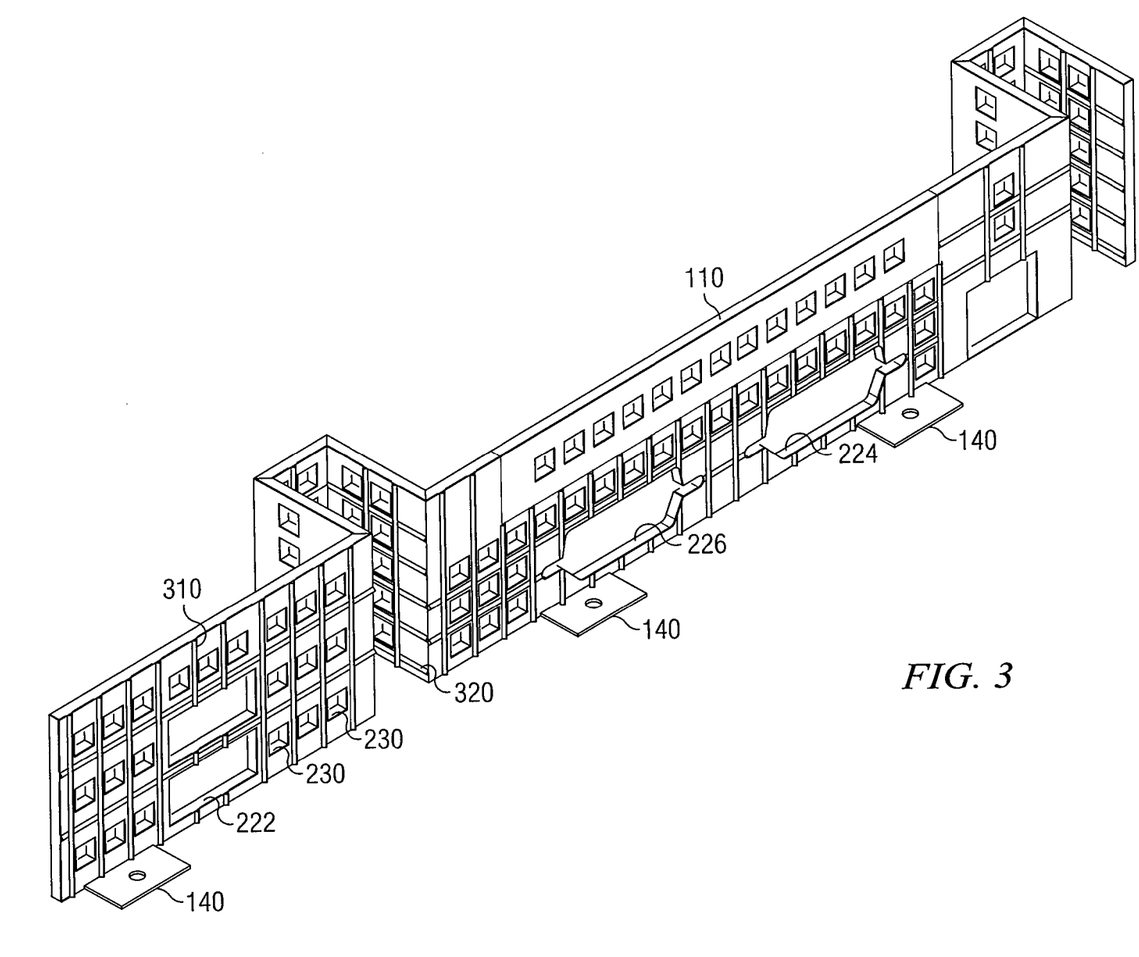
FIG. 3 depicts the reverse isometric view of the embodiment of wall member shown in FIG. 1.

FIG. 3 depicts the reverse isometric view of the embodiment of wall member 100 shown in FIG. 1. The reverse view of FIG. 3 provides a better view of structural support members 300. It should be noted, however, that wall member 100 may include structural support members 300 extending in any direction from the general plane defined by wall member 100 and that structural support members 300 may extend from either side of wall member 100.

Structural support members 300 may extend from wall member 100 to resist deformation of wall member 300 in at least one direction. Structural support members 300 may include any shape, size, and/or form of supporting structure (e.g., ribs, beams, columns, flanges, girders, trusses, and/or any other appropriately shaped structure). Structural support members 300 may be designed to increase the resistance of wall member 100 to deformation in any plane or direction. For instance, vertical ribs 310 may resist compressive or tensile forces from top 106 to bottom 108. As another example, horizontal ribs 320 may resist compressive or tensile forces from left end 102 to right end 104. Structural support members 300 may assist wall member 100 resist sag in chassis 400 by increasing the moment of inertia of wall member 100. A greater moment of inertia provides reduced bending for a given applied force.

As is shown in FIG. 3, structural support members 300 may include thin ribs located adjacent to one or more holes 200. For example, wall member 100 may include structural support members 300 around every hole 200, around selected holes 200, or dispersed in a pattern on wall member 200 without correspondence to specific holes 200. In addition, persons having ordinary skill in the art will recognize that structural support members 300 may include beams and/or ribs that cover the entire surface of wall member 100 between two holes 200 and/or other features of wall member 100.

Figure 4:
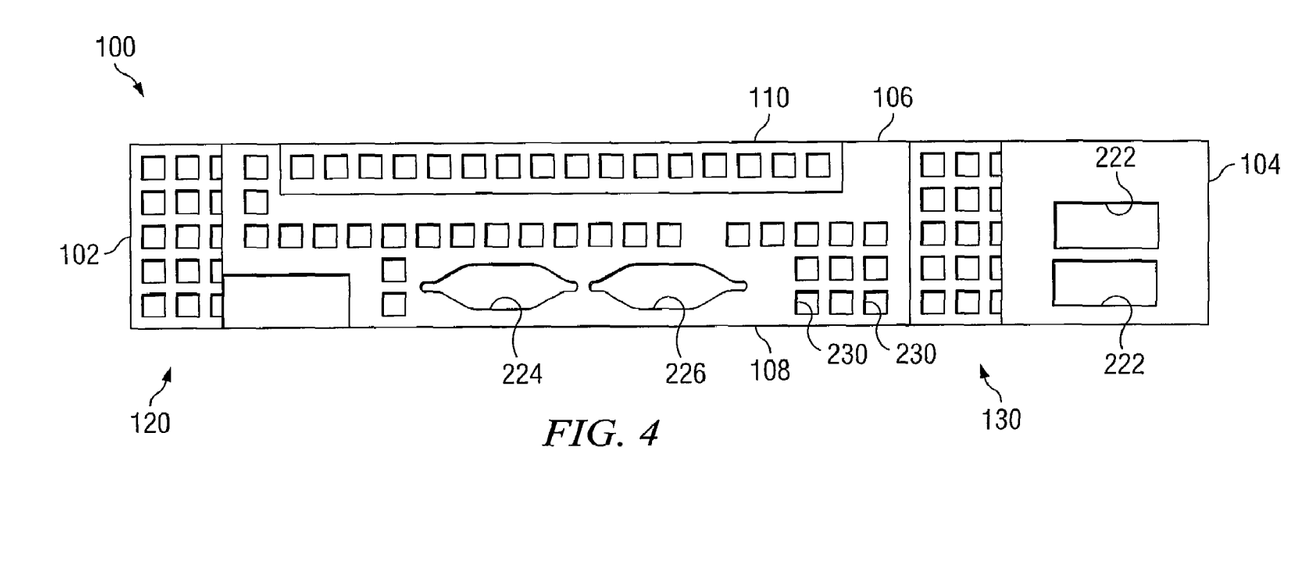
FIG. 4 depicts the front view of the embodiment of wall member 100 shown in FIG. 1.

FIG. 4 depicts the front view of the embodiment of wall member 100 shown in FIG. 1.

Figure 5:
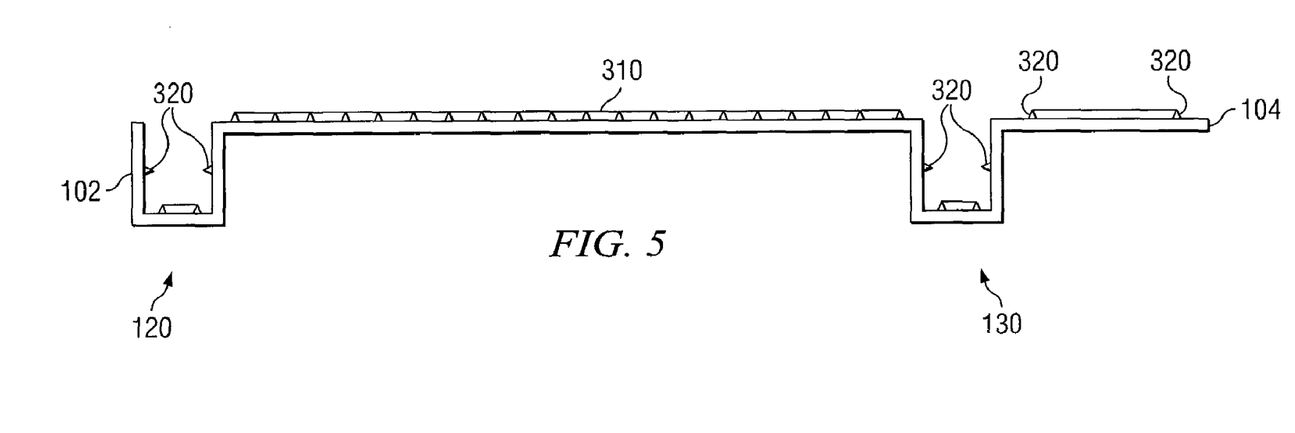
FIG. 5 depicts the top view of the embodiment of wall member 100 shown in FIG. 1.

FIG. 5 depicts the top view of the embodiment of wall member 100 shown in FIG. 1.

Figure 6:
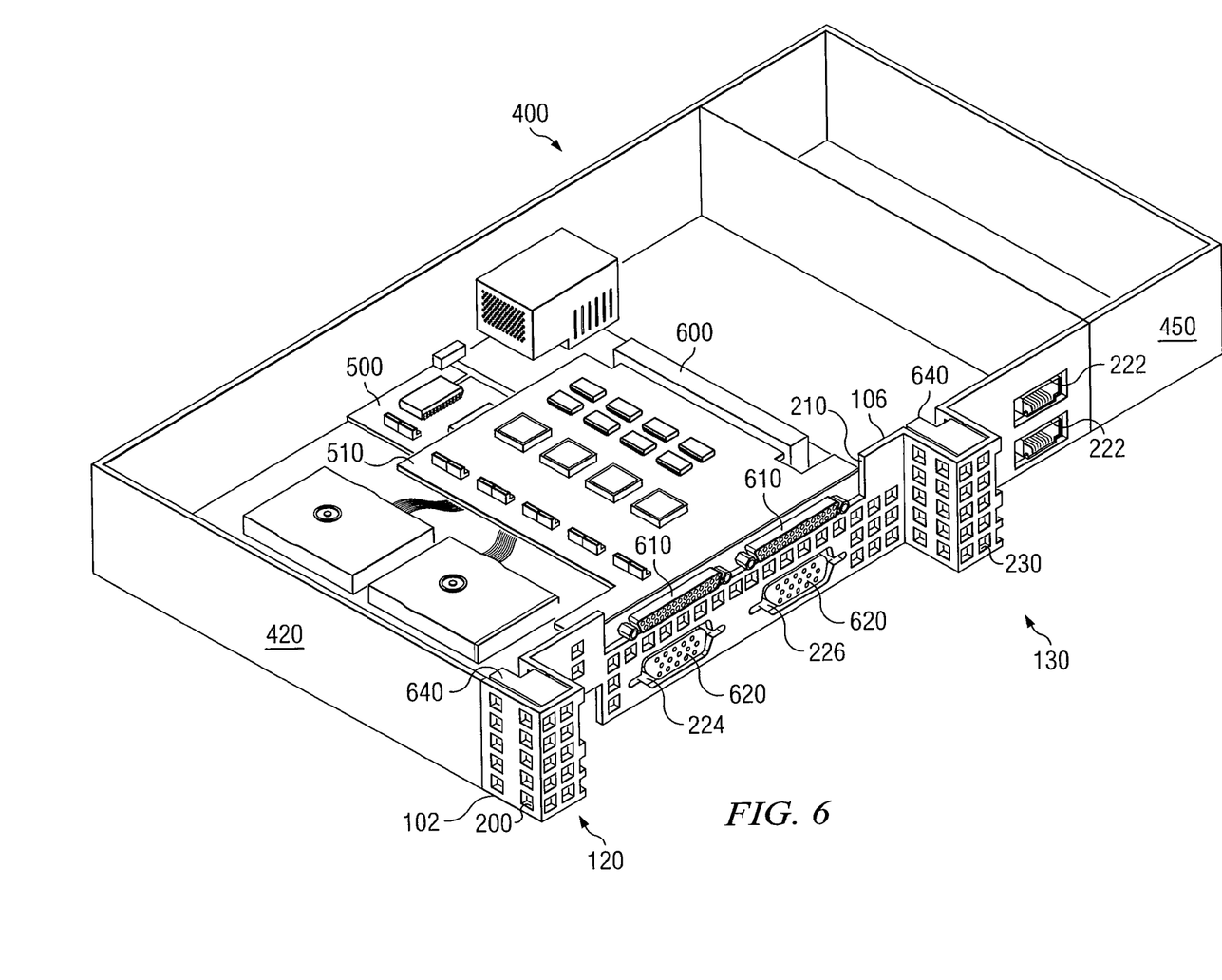
FIG. 6 depicts an isometric view one embodiment of a chassis for a modular component of an information handling system incorporating a wall member in accordance with teachings of the present disclosure.

FIG. 6 depicts an isometric view one embodiment of a chassis 400 for a modular component of an information handling system incorporating a wall member 100. In the example depicted in FIG. 6, wall member 100 is configured for use as a rear input/output wall of chassis 400. FIG. 6 also shows example electronic components that may be included in a modular component of an information handling system (e.g., a motherboard 500).

As previously discussed in relation to FIG. 1, wall member 100 as shown in FIG. 6 may include some holes 200 configured for input/output connectors 620 and some holes 200 configured for venting air. In addition, wall member 100 may include one or more slots 210 and corresponding slot covers 110.

Slots 210 may be any feature of wall member 100 configured for providing a proper interface with internal components. For example, in applications as the rear input/output wall of a server rack chassis, slots 210 may be configured to allow connectors 610 associated with an expansion card 510 (e.g., a PCI card) to be exposed through wall member 100.

Slots 210 may be useful in applications including expansion cards 510 (e.g., PCI expansion cards). In such embodiments, motherboard 500 may include one or more expansion card sockets 600 (e.g., PCI slots). Some known expansion cards 510 include a set of input/output connectors that may protrude through the rear wall of a server rack chassis, namely through slots 210.

In previous rear input/output walls of a server rack chassis, such expansion slots are often generally rectangular holes through the wall. As previously discussed, material removal to create such an expansion slot may increase the tendency of the wall to deform, and/or to transmit EMI and/or ESD. The teachings of the current disclosure may be used to counteract such tendencies.

In addition, previous rear input/output walls of a server rack chassis often include expansion slots surrounded by four sides of the wall. Insertion of expansion card connectors 610 through such a slot may require rotation of expansion card 510 during installation. The teachings of the present disclosure may allow formation of slot 210 with one side completely open, as shown in FIG. 6. Removal of one side may allow expansion card connectors 610 to extend through wall member 100 without rotation of the expansion card 510. Installation without rotation may reduce the time, cost, and/or complication of installing expansion cards 510. In addition, eliminating the need to rotate expansion cards may reduce mechanical stresses applied to wall member 100, expansion card connectors 610, and/or expansion socket 600 associated with electronic components within chassis 400 (e.g., a PCI expansion socket on a motherboard).

Embodiments of wall member 100 including one or more slots 210 may include corresponding slot covers 110. Slot cover 110 may provide structural support in the absence of an expansion card in slot 210. Slot covers 110 may provide additional surface area for vent holes 230 or structural support members 300. Slot covers 110 may be formed of any appropriate material (e.g., stamped metal, cast aluminum, etc.). Slot covers 110 may be configured for removal with or without removal of portions of chassis 400 and may be retained when slots 210 are not in use by cover retainers 630.

Cover retainers 630 may include any feature or device configured for holding slot covers 110 in place. In the embodiment shown in FIG. 6, cover retainers 630 may include a notch or other feature of wall member 100 configured to house a tab and/or other feature of slot cover 110. In such embodiments, slot cover 110 may be removed from wall member 100 by sliding the tab out of the notch. Persons with ordinary skill in the art will recognize that such cover retainers may include a myriad of shapes, forms, and/or devices to accomplish this feature.

In embodiments such as that shown in FIG. 6, wall member 100 may include expansion card retainers 640. In other embodiments, expansion card retainers 640 may include additional devices or components associated with chassis 400. In those embodiments including expansion card retainers 640, expansion card retainers 640 may include any feature or device configured for retaining expansion card 510 when expansion card 510 is inserted in expansion socket 600. In some embodiments, there may be no expansion card retainers 640 at all. In those embodiments, the physical connection between expansion card 510 and expansion socket 600 may be sufficient to hold expansion card 510 in place without need for additional features, devices, and/or components.

Figure 7:
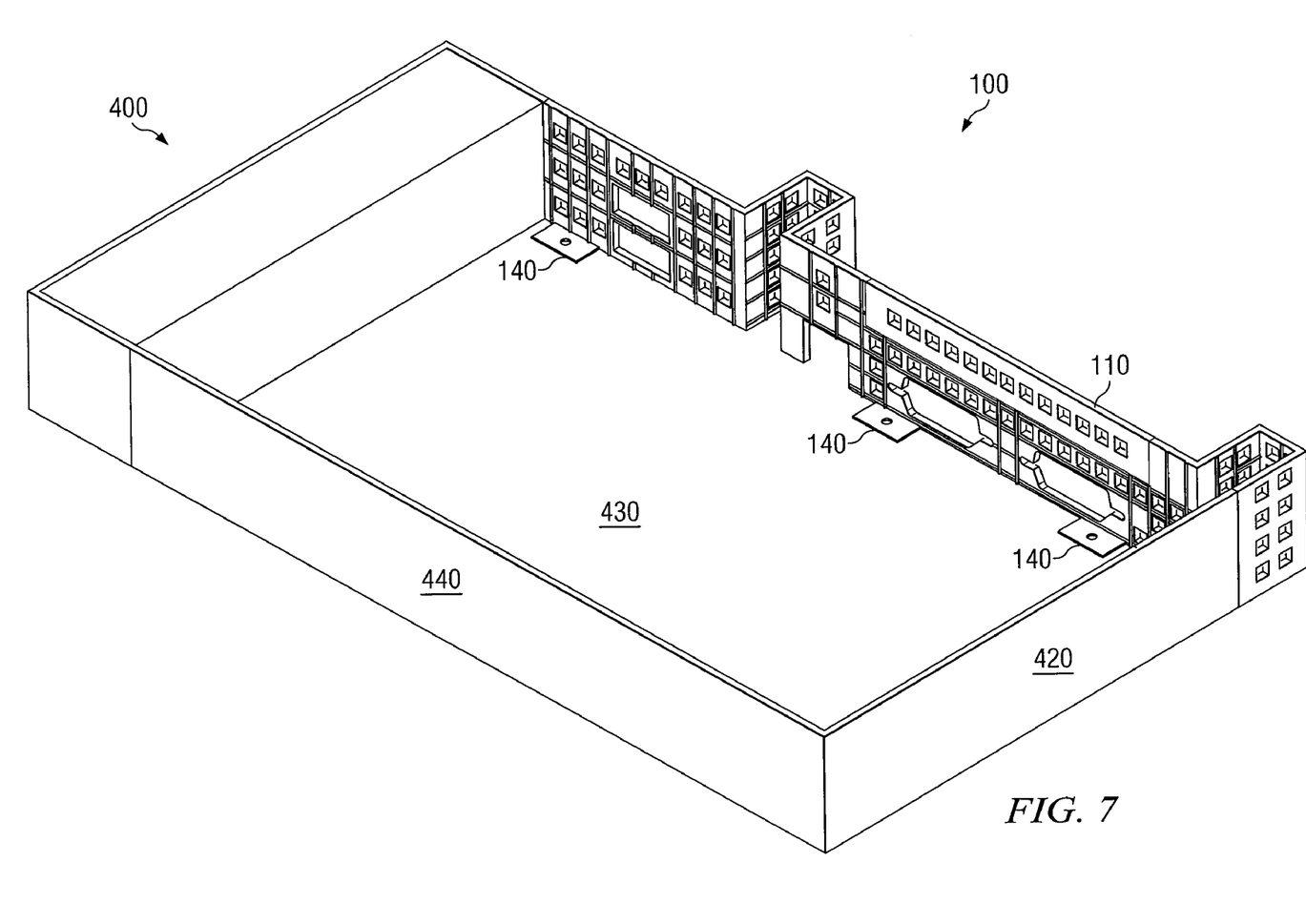
FIG. 7 depicts an isometric view of the embodiment of a chassis with the top removed for a modular component of an information handling system incorporating a wall member in accordance with teachings of the present disclosure.

FIG. 7 depicts an isometric view of the embodiment of a chassis 400 for a modular component of an information handling system incorporating a wall member shown in FIG. 2. In FIG. 7, top 410 has been removed to show some features of chassis 400 and wall member 100. For example, as shown in FIG. 7, wall member 100 may include one or more feet 140 disposed along the bottom edge 108 of wall member 100. In other examples, feet 140 may be disposed along any edge, surface, and/or portion of wall member 100. Feet 140 may provide connection points between wall member 100 and chassis 400. Any appropriate method of connection may be used (e.g., rivets, screws, clips, etc.) to connect wall member 100 to chassis 400. In some embodiments, wall member 100 may be formed integral with some other component of chassis 400 and may not include any feet 140.

Although the figures and embodiments disclosed herein have been described with respect to server chassis and information handling systems, it should be understood that various changes, substitutions and alternations can be made herein without departing from the spirit and scope of the disclosure as illustrated by the following claims. For instance, the teachings of the present disclosure may be applied to other boxes, containers, and chassis configured for housing electronics components.

What is claimed is:

1. A housing for a modular component of an information handling system, the housing comprising:
 a wall member generally defining a first plane;
 the wall member having a first end, a second end, a top, and a bottom;
 one or more holes formed in the wall member;
 one or more structural support members adjacent to the one or more holes;
 the one or more holes disposed between one of the one or more structural support members and one of the first end, the second end, the top, or the bottom of the wall member;
 at least one of the holes configured to allow the insertion of an input/output connector through the wall member;
 an edge of the wall member disposed adjacent the at least one of the holes and formed to facilitate alignment of the connector with the corresponding hole; and
 the one or more structural supports extending from the first plane defined by the wall member to resist deformation of the wall member in at least one direction.

2. The housing of claim 1 further comprising at least one of the holes configured to allow the insertion of an input/output connector through the wall member.

3. The housing of claim 1 further comprising:
 a chamfered edge of the wall member disposed adjacent the at least one of the holes to facilitate alignment of the connector with the corresponding hole.

4. The housing of claim 1 further comprising at least one of the holes configured for venting air through the wall member.

5. The housing of claim 1 further comprising the wall member configured for restricting electromagnetic interference passage through the wall member.

6. The housing of claim 1 further comprising the wall member configured for restricting electrostatic discharge passage through the wall member.

7. The housing of claim 1 further comprising:
 a removable slot cover revealing a slot when removed; and
 a card retainer configured to releasably clamp a card in position with respect to the slot.

8. The housing of claim 1 further comprising a removable slot cover revealing a slot when removed, the slot cover including one or more holes configured for venting air through the slot cover.

9. The housing of claim 1 further comprising the wall member configured as the rear wall of a chassis.

10. A modular component of an information handling system, the component comprising:
 a wall member generally defining a first plane;
 the wall member having a first end, a second end, a top, and a bottom;
 one or more holes formed in the wall member; and one or more structural support members adjacent to the one or more holes, the one or more structural supports extending from the first plane defined by the wall member to resist deformation of the wall member in at least one direction;
 at least one of the holes configured to allow the insertion of an input/output connector through the wall member;
 an edge of the wall member disposed adjacent the at least one of the holes and formed to facilitate alignment of the connector with the corresponding hole; and
 the one or more holes disposed between one of the one or more structural support members and one of the first end, the second end, the top, or the bottom of the wall member.

11. The modular component of claim 10 further comprising at least one of the holes configured to allow the insertion of an input/output connector through the wall member.

12. The modular component of claim 10 further comprising at least one of the one or more holes configured for venting air through the wall member.

13. The modular component of claim 10 further comprising:
 a removable slot cover revealing a slot when removed; and
 a card retainer configured to releasably clamp a card in position with respect to the slot.

14. The modular component of claim 10 further comprising a removable slot cover revealing a slot when removed, the slot cover including one or more holes configured for venting air through the slot cover.

15. The modular component of claim 10 further comprising the wall member configured as the rear wall of a chassis.

16. A method of forming a housing for a modular component of an information handling system, the method comprising:

using a casting process to form a wall member generally defining a first plane, the wall member having a first end, a second end, a top, and a bottom;

the wall member comprising:
- one or more holes formed in the wall member;
- one or more structural support members adjacent to the one or more holes, the one or more structural supports extending from the first plane defined by the wall member to resist deformation of the wall member in at least one direction;

at least one of the holes configured to allow the insertion of an input/output connector through the wall member;

an edge of the wall member disposed adjacent the at least one of the holes and formed to facilitate alignment of the connector with the corresponding hole; and the one or more holes disposed between one of the one or more structural support members and one of the first end, the second end, the top, or the bottom of the wall member.

17. The method of claim 16 further comprising at least one of the holes configured to allow the insertion of an input/output connector through the wall member.

18. The method of claim 16 further comprising at least one of the one or more holes configured for venting air through the wall member.

19. The method of claim 16 further comprising the wall member configured as the rear wall of a chassis.

* * * * *